US010666266B1

(12) United States Patent
Rajasekharan et al.

(10) Patent No.: US 10,666,266 B1
(45) Date of Patent: May 26, 2020

(54) CONFIGURATION ENGINE FOR A PROGRAMMABLE CIRCUIT

(71) Applicant: Xilinx, Inc., San Jose, CA (US)

(72) Inventors: Karthy Rajasekharan, Cupertino, CA (US); Weiguang Lu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/212,566

(22) Filed: Dec. 6, 2018

(51) Int. Cl.
  *H03K 19/1776* (2020.01)
  *H03K 19/17724* (2020.01)
  *H03K 19/17704* (2020.01)

(52) U.S. Cl.
  CPC ... *H03K 19/1776* (2013.01); *H03K 19/17708* (2013.01); *H03K 19/17724* (2013.01)

(58) Field of Classification Search
  None
  See application file for complete search history.

(56) References Cited

U.S. PATENT DOCUMENTS

| | | | | |
|---|---|---|---|---|
| 5,426,379 A * | 6/1995 | Trimberger | ............... | G06F 5/10 326/38 |
| 5,450,484 A * | 9/1995 | Hamilton | ................ | G10L 25/78 379/351 |
| 5,463,762 A * | 10/1995 | Morrissey | ............... | G06F 11/10 710/30 |
| 5,832,310 A * | 11/1998 | Morrissey | ............. | G06F 13/122 710/71 |
| 6,137,307 A * | 10/2000 | Iwanczuk | ........ | H03K 19/17748 326/38 |
| 6,204,687 B1 * | 3/2001 | Schultz | ............... | G06F 17/5054 326/38 |
| 6,255,848 B1 * | 7/2001 | Schultz | .............. | H03K 19/1776 326/38 |
| 6,836,842 B1 * | 12/2004 | Guccione | ............ | G06F 15/7867 713/100 |
| 7,689,726 B1 * | 3/2010 | Sundararajan | ........ | G06F 9/4401 326/38 |
| 8,103,992 B1 * | 1/2012 | Chan | ................... | G06F 17/5054 716/100 |
| 10,349,005 B2 * | 7/2019 | Gilmutdinov | | |
| 2012/0057803 A1 * | 3/2012 | Wakazono | ............. | G06T 5/002 382/274 |
| 2015/0279319 A1 * | 10/2015 | Zhu | .......................... | G09G 5/02 345/694 |
| 2016/0094803 A1 * | 3/2016 | Possos | ................... | H04N 7/012 348/448 |
| 2018/0167630 A1 * | 6/2018 | Zhao | ................... | H04N 21/8358 |
| 2019/0042874 A1 * | 2/2019 | Possos | ............... | G06K 9/00765 |

\* cited by examiner

*Primary Examiner* — Crystal L Hammond
(74) *Attorney, Agent, or Firm* — Patterson + Sheridan, LLP

(57) ABSTRACT

Apparatus and method relate generally to a configuration engine. In one such configuration engine for a programmable circuit, a frame counter includes a cascade of frame incrementer circuits associated with columns for a row of circuit blocks. Each frame incrementer circuit is configured to provide frame sums for frames associated with the circuit blocks. The frame counter is configured to sequentially add the frame sums for the columns to provide corresponding frame totals respectively for circuit types of the circuit blocks. A termination circuit is configured to multiplex the frame totals onto a data bus. A row controller is configured to initiate the frame counter and to selectively access the frame totals provided to the data bus.

20 Claims, 7 Drawing Sheets

CONFIGURATION ENGINE FOR A PROGRAMMABLE CIRCUIT

TECHNICAL FIELD

The following description relates to integrated circuit devices ("ICs"). More particularly, the following description relates to a configuration engine for a programmable circuit.

BACKGROUND

Integrated circuits have become more "dense" over time, i.e., more logic features have been implemented in an IC of a given size. Along those lines, such integrated circuits have been organized into one or more matrices of blocks of circuits ("circuit blocks") of one or more types of circuits. With respect to programmably programmable circuit blocks, configuration memory cells may be used. These configuration memory cells may be organized into groups, such as frames. A frame of configuration memory cells may be associated with a circuit block type for programmable configuration of same.

SUMMARY

An apparatus relates generally to a configuration engine for a programmable circuit. In such an apparatus, a frame counter includes a cascade of frame incrementer circuits associated with columns for a row of the circuit blocks. Each frame incrementer circuit is configured to provide frame sums for frames associated with the circuit blocks. The frame counter is configured to sequentially add the frame sums for the columns to provide corresponding frame totals respectively for circuit types of the circuit blocks. A termination circuit is configured to multiplex the frame totals onto a data bus. A row controller is configured to initiate the frame counter and to selectively access the frame totals provided to the data bus.

A method relates generally to a configuration engine for a programmable circuit. In such a method, an initial vector from a row controller is input to an initial one of a cascade of frame incrementer circuits of a frame counter. Amounts of frames are added on a column-by-column basis for a row of circuit blocks with the frame incrementer circuits to provide frame sums for the frames for circuit types associated with the circuit blocks. The frame sums are sequentially added by the frame counter to provide corresponding frame totals respectively for the circuit types of the circuit blocks. The frame totals are selectively accessed by the row controller.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 2-1 is a block diagram depicting an example of a matrix.

FIG. 2-2 is a block diagram depicting another example of a matrix.

FIG. 2-3 is a block diagram depicting yet another example of a matrix.

FIG. 3 is a circuit diagram depicting an example of a hardwired circuit.

DETAILED DESCRIPTION

Figure 1:
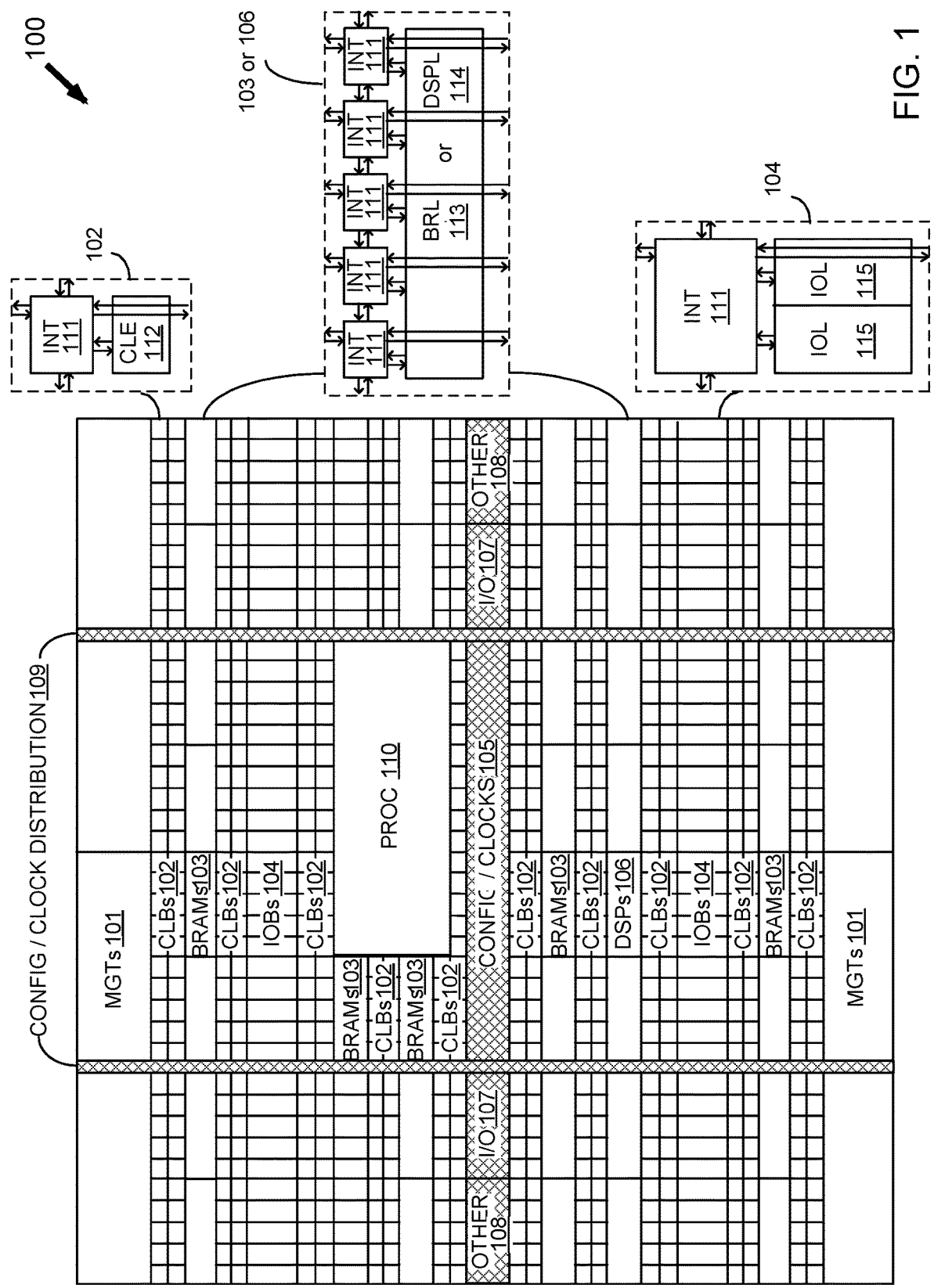
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

In a microelectronic component having reconfigurable elements, such as in a field programmable gate array ("FPGA") for example, a configuration engine is used to configure various programmably reconfigurable elements. Examples of applications for a configuration engine in such a microelectronic component include "house cleaning," circuit configuration, and readback of a programmed circuit configuration, among others.

A central or main configuration controller may receive configuration data, such as in the form of a configuration bitstream for example, and such configuration data is sent out to configuration memory cells for programming responsive to such configuration data. Configuration memory cells used for programming reconfigurable elements in such a microelectronic component may be located throughout such a semiconductor die or a microchip. This decentralized nature of configuration memory cells conventionally made determining a number of frames of such configuration memory cells for different types of circuit blocks problematic.

Conventionally, a central or main configuration controller receives configuration data for programming one or more frames or other groupings of configuration memory cells. Frames of configuration memory cells, including all or just a portion of a frame, are used for programmably configuring different circuit blocks of different types of circuits. For purposes by way of example and not limitation, it shall be assumed that an integrated circuit with configuration memory cells is an FPGA; however, other types of integrated circuits with reconfigurable elements via configuration memory cells, for example, may be used.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the FPGA, typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation. Accordingly, different types of circuit blocks in an FPGA may include IOBs, CLBs, BRAMs, DSPs, DLLs, and other types of circuit blocks.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects to the hard-coded transistor logic.

An FPGA thus may be thought of as including one or more matrices of different types of circuit blocks. For purposes of clarity by way of example and not limitation, a single matrix of circuit blocks of different types is described, as such description extends to one or more matrices of circuit blocks of different types.

Rows and columns of circuit blocks may be in an FPGA. Generally, circuit blocks of a particular type are associated with a column; however, a column may have circuit blocks of more than one type. Rows, which span columns of different circuit types, correspondingly have circuit blocks of different types. Each of such circuit blocks may have at least one frame, including a sub-frame or partly used number of bits of a frame, of configuration memory cells associated therewith.

Conventionally, a row controller associated with a row of circuit blocks cycled through each column, where each column for a row had an associated frame counter and row controller. Two sets of flag circuitry were used to provide feedback to the row controller. Frame flag circuitry was used to determine whether a last frame in a column was reached, and column flag circuitry in each frame counter was used to determine whether such column was a last column in such a row.

A frame counter is used to count a number of frames in each column for such row for each circuit block type in such column of such row. Frame counters corresponding to columns of circuit blocks are cascaded to produce a total number of frames for each frame type. Such a row controller thus was configured to address each frame in a column of an associated row, and then, after a complete count of frames was obtained for all circuit blocks in such a column associated with such row, then a row controller was configured to increment to a next column responsive to a "not last" column flag, namely a "last" column flag from flag circuitry was not yet reached. After sequencing to a last column as indicated by a "last" column flag of flag circuitry for an associated frame counter, and sequencing through all frames in such last column, output from a last frame counter, namely a last frame flag, and a last column flag was readout for each circuit block type in order to increment addresses for each frame. This readout was performed for each FPGA configuration or configuration readback, which added significant delay for each such configuration and configuration readback.

Therefore, at each startup of an FPGA for example, the above-described conventional process repeated for each frame counter of each column in a row until a frame count of a last column was obtained along with a "last" column flag from flag circuitry for such associated frame counter. Having to sequence through frames for each column and sequence through columns is excessively time consuming, and too slow for high-speed FPGAs. Moreover, such a conventional row controller configured to sequence through frames and columns is complex, and flag circuitry adds to circuitry overhead and such complexity.

As described below in additional detail, a configuration engine is configured to self-learn a configuration memory space of configuration memory cell frames of a microelectronic component. Such a self-learned configuration memory space allows subsequent allocation of frames by a configuration engine to be significantly faster, as a number of frames for each circuit block type for each row can be determined more readily than before. Furthermore, a less complex row controller may be used, with avoidance of flag circuitry and frame and column sequencing, circuitry overhead is reduced in comparison with a conventional configuration engine.

With the above general understanding borne in mind, various configurations for a configuration engine are generally described below.

As noted above, FPGAs can include several different types of programmable logic blocks in an array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

FIG. 2-1 is a block diagram depicting an example of a matrix 200. In this example of matrix 200, there are six types of circuit blocks for a programmably reconfigurable microelectronic component, such as of FPGA 100 of FIG. 1. However, these and/or other types of circuit blocks may be used in other examples. Furthermore, more or fewer types of circuit blocks may be used in other examples.

In this example, rows 201R-204R and columns 201C-204C form a matrix of circuit blocks configured with a portion of a configuration engine, as described below in additional detail. In this example, circuit types of circuit blocks 102, 103, 104, 106 include two types of BRAM block types, a CLB type, two types of IOB types, and a DSP block type. In this example, one BRAM block 103-1 of such BRAM block types may be an 18-bits wide "primitive," and another one BRAM block 103-2 of such BRAM block types may be a 36-bits wide "primitive." A "primitive" is a known term of art, which may be generally thought a programmable circuitry block having programmably definable circuitry within a template provided by such programmable circuitry block. In this example, BRAM is used; however, other examples of different types of memory may be used in other examples. Furthermore, in this example, one IOB 104-1 of such IOB types may be a clocked block type, and another one IOB 104-2 of such IOB types may be a non-clocked block type. However, other examples of different IOB types may be used in other examples.

In the example of matrix 200, each of columns 201C-204C is homogenous with respect to general circuit type, namely: column 201C is all CLBs 102; column 202C is all BRAM blocks 103 though different types thereof; column 203C is all IOBs 104 though different types thereof; and column 204C is all DSP blocks 106. For a configuration engine, additional outer bracketing columns 213 and 214 are added to such matrix 200 of circuit blocks to continue a matrix topology for purpose of clarity and not limitation. Left or input side column 213 is a column of row controllers 211. Right or output side column 214 is a column of termination circuits 212. These columns 213 and 214 are provided for purposes of clarity, and in other examples, one or more of these columns may be embedded within rows 201R-204R of circuit blocks.

A configuration engine may include a frame counter 210, a termination circuit 212, and a row controller 211 on a row-by-row basis, as in this example. In this example, frame counter 210 is shown in each circuit block, such as for example circuit blocks 102, 103, 104, 106, as frame counter 210$i$ for i a positive integer greater than zero. As described below in additional detail, a frame counter 210 has a cascade of frame incrementer circuits, where each of such frame incrementer circuits corresponds to a column of circuit blocks, such as columns 201C-204C. Thus, even though multiple instances of frame counter blocks 210-$i$, where i corresponds to a row number, appear embedded in each of circuit blocks 102, 103, 104, 106, for each row 201R-204R, these frame counter blocks 210-$i$ represent a portion of a frame counter 210 per row. For example, frame counter portions 210-1 in columns 201C-204C represent a frame counter 210-1 for row 201R. Similarly, frame counter portions 210-2 through 210-4 striped across columns 201C-204C may respectively correspond to frame counters 210-2 through 210-4. In this example, there is a set of a frame counter 210, a termination circuit 212, and a row controller 211 for each row 201R-204R. Again, columns 201C-204C of circuit blocks are to be distinguished from columns 213 and 214 having components of a configuration engine, which circuit topology is provided for purposes of clarity and not limitation.

Each frame incrementer circuit of a frame counter 210 may be associated with one or more frames of configuration memory cells 220. In this example, one or more frames of configuration memory cells 220 is depicted as being embedded in each of circuit blocks 102, 103, 104, 106. Conventionally, a frame of configuration memory cells is thousands of bits wide or long, and thus there may be a corresponding number of configuration memory cells 220. Different circuit types may have different numbers of one or more frames of configuration memory cells 220 associated therewith. In this example, it is assumed that conventional configuration memory cells are used, namely one bit per configuration memory cell; however, in other examples, more than one bit per configuration memory cell may be used.

As is known, a configuration data stream, such as for example a configuration bitstream, may be used to program configuration memory cells 220 to program programmable circuit blocks, such as circuit blocks 102, 103, 104, 106 for example. Such configuration memory cells 220 for an FPGA may be reprogrammable, as is known.

Within configuration memory cells 220, there are at least one, and possibly more, frames worth of data inputs for frames of configuration memory cells 220. For an application using less than an entire frame of configuration memory cells 220, such partial usage is counted as one frame. For example, if a circuit block uses only 28 bits of 64 bits of a frame for configuration of such circuit block, such frame usage is rounded up to count as one frame. However, if a circuit block uses 96 bits of configuration data for configuration memory cells 220, then such circuit block would be counted as using two frames.

At startup of an integrated circuit, such as an FPGA, there is a startup routine. As described herein, this process with respect to a configuration engine involves a self-learning or self-discovery of such integrated circuit to determine how many frames of each circuit type of circuit blocks associated with configuration memory cells are present in such integrated circuit. There is at least one frame, which is assumed to be at least one frame per circuit block, but there may be more than one frame per circuit block. For purposes of clarity by way of example and not limitation, it is assumed that there is at least one frame, rounded up, per circuit block; however, in other examples, circuit blocks may share one or more frames of configuration memory cells 220.

In FIG. 2-2, there is shown a block diagram depicting another example of a matrix 200, where columns 201C-204C are not all homogenous with respect to circuit types. In this example of matrix 200, again there are six types of circuit blocks for a programmably reconfigurable microelectronic component, such as in FIG. 2-1. However, in this example, column 201C is a combination of CLBs 102 and different types of BRAM blocks 103; column 202C is a combination of different types of IOBs 104 and different types of BRAM blocks 103; column 203C is all CLBs 102; and column 204C is a combination of DSP blocks 106 and different types of BRAM blocks 103. Accordingly, generally a matrix 200 may have homogenous columns with respect to types of circuit blocks, heterogeneous columns with respect to a mixture of different types of circuit blocks, or a combination thereof.

In this example, columns 201C-204C are in effect column-by-column partitioned by a one-to-one correspondence with frame incrementer circuits **210-*i* of a corresponding frame counter 210-*i*, for i an corresponding row number. In another example, multiplexers may be added so a frame incrementer circuit 210-*i* may support more than one column. Furthermore, in another example, a column may not include any configuration memory programmable circuitry, and so such a column may not include any frame incrementer circuit. However, for purposes of clarity by way of example and not limitation, it shall be assumed that a one-to-one correspondence exists between columns and frame incrementer circuits for an integrated circuit or at least a portion thereof. Frames are associated with groupings of configuration memory cells 220 and programmably reconfigurable circuit blocks, such as circuit blocks 102, 103, 104, 106** for example. However, a column of circuit blocks may not all be of a same type, and even if a same type, may not all have a same configuration responsive to programming of configuration memory cells, as some circuit blocks of a same type may have different configurable feature sets.

Figure 3:
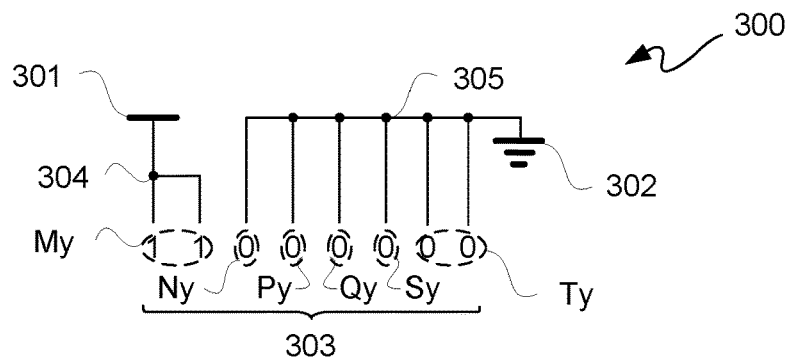

FIG. 2-3 is a block diagram depicting yet another example of a matrix 200. This example of matrix 200 is the same as in FIG. 2-1, except for the following differences. There is one row controller 211 and one termination circuit 212 for each two rows of circuit blocks 102, 103, 104, and 106. In this example, a multiplexer of termination circuit 212, described below in additional detail, may be coupled to more than one frame counter output, and a row controller 211 may be configured to initiate more than one frame counter 210 at a time.

As will be understood from the following description, row controller 211 is substantially less complex and uses substantially less circuitry than a conventional row controller for a conventional configuration engine. Accordingly, having a row controller 211 per row 201R through 204R does not add a substantial amount of circuitry in order to increase speed of self-learning on each row. However, in applications where a slower self-learning configuration speed is acceptable, there may be one row controller 211 per each two or more rows, or a combination of one or more row controllers 211 per row and one or more row controllers 211 per each two or more rows. For purposes of clarity by way of non-limiting example, one row controller 211 per each of rows 201R-204R is further described, as such description is extendible to one row controller and one termination per two or more rows at a time.

FIG. 3 is a circuit diagram depicting an example of a hardwired circuit 300. Hardwired circuit 300 is further described with simultaneous reference to FIGS. 1 through 3.

One or more hardwired circuits 300 may be included in a frame counter 210. In this example, hardwired circuit 300 is for a column, such as any of columns 201C-204C for example, of circuit blocks within a row. In this example, a hardwired circuit 300 may be embedded in each circuit block in a column of circuit blocks. In another example, a hardwired circuit 300 may be for more than one column and/or more than one row.

Hardwired circuit 300 is factory configured to provide a number of binary 0s and/or 1s, which in this example is an 8-bit number 303. In this example, wires 304 of hardwired circuit 300 may be connected to a supply voltage logic level bus 301 to provide binary 1s in number 303, and other wires 305 of hardwired circuit 300 may be connected to a ground voltage logic level bus 302 to provide binary 0s in number 303. In this example, number 303 is a binary 110000. However, other binary numbers may be used in other examples. Furthermore, lengths other than 8-bits may be used in other examples. The non-limiting example of binary number 303 is provided for purposes of clarity by way of example, and it will be appreciated that other configurations of number 303 may be used in accordance with the following description.

In this example, a first two bits of binary number 303, namely My, are 11. In this example, this means that there are three frames for a circuit type M associated with a column y in a matrix of circuit columns, such as circuit columns 201C through 204C for example. Moreover, in this example, a third bit of binary number 303, namely Ny, is 0. In this example, this means that there are zero frames for a circuit type N associated with a column y. In this example, there are six different circuit types M, N, P, Q, S, and T; however, in another example, fewer or more circuit types may be partitioned out for corresponding frames. If a circuit type is present in a column y, then there is at least one frame count for such circuit type for such column. If a circuit type is not present in a column y, then a count of zero frames for such circuit type is used for such column.

For purposes of clarity by way of example and not limitation, assume that hardwired circuit 300 is for a matrix 200 of FIG. 2-1 and that y is for a second column of circuit blocks, namely column 202C, and assume that hardwired matrix 300 is embedded in a first row 201R in such column 202C in such matrix. Further, assume that M, N, P, Q, S, and T respectively are for BRAM blocks 103-1, CLBs 102, DSP blocks 106, IOBs 104-1, IOBs 104-2, and BRAM blocks 103-2. For this example of number 303, there are three frames My of configuration memory cells 220 for a circuit type for BRAM blocks 103-1, and there are zero frames each for circuit types N, P, Q, S, and T. By embedding hardwired circuits 300 in circuit blocks of matrix 200, frames are circuit-type-by-circuit-type partitioned by corresponding hardwired values, or corresponding portions of a hardwired value or vector 303, by one or more embedded hardwired circuits 300 of a frame counter 210.

Figure 4:
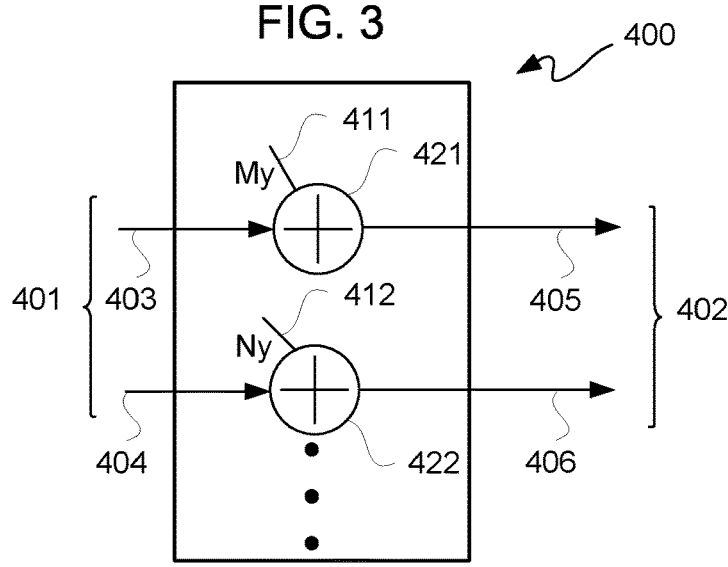
FIG. 4 is a schematic diagram depicting an example of a frame incrementer circuit.

FIG. 4 is a schematic diagram depicting an example of a frame incrementer circuit 400. Frame incrementer circuit 400 is further described with simultaneous reference to FIGS. 1 through 4. With respect to FIG. 4, as well as other figures herein, even though single lines may be depicted for a bus, such as for example a signal bus, such single lines may represent one or more lines for carrying information.

Frame incrementer circuit 400 may be an example of a frame incrementer circuit portion 210-i of a frame counter 210-i. In this example of frame incrementer circuit 400, there are at least two adders, namely adder 421 and adder 422. The number of adders in a frame incrementer circuit 400 may correspond to the number of circuit types in a matrix to be processed by a configuration engine. For the above example of six circuit types, each frame incrementer circuit 400 may include six adders.

An input bus 401 of frame incrementer circuit 400 may respectively receive a current frame count for a column to which frame incrementer circuit 400 is associated. Input 403 of input bus 401 may be a current frame count for a first circuit type, and input 404 of input bus 401 may be a current frame count for a second circuit type different from such first circuit type. Inputs 403 and 404 may be respectively input to adders 421 and 422.

A hardwired circuit, such as for example hardwired circuit 300, may provide a frame count for each circuit type in a column associated with such frame incrementer circuit 400, as well as each circuit type not in such column but in a matrix, such as circuit columns 201C through 204C of matrix 200. In this example, adders 421 and 422 respectively receive frame counts My 411 and Ny 412 for respective addition with a current frame count on input 403 and a current frame count on input 404. A current frame count on input 403 is for a same circuit type as My, and a current frame count on input 404 is for a same circuit type as Ny.

Output of adder 421 is a sum of a current frame count on input 403 and a frame count My 411, which output is a frame sum 405 on an output bus 402 of frame incrementer circuit 400. Output of adder 422 is a sum of a current frame count on input 404 and a frame count Ny 412, which output is a frame sum 406 on an output bus 402 of frame incrementer circuit 400.

Figure 5:
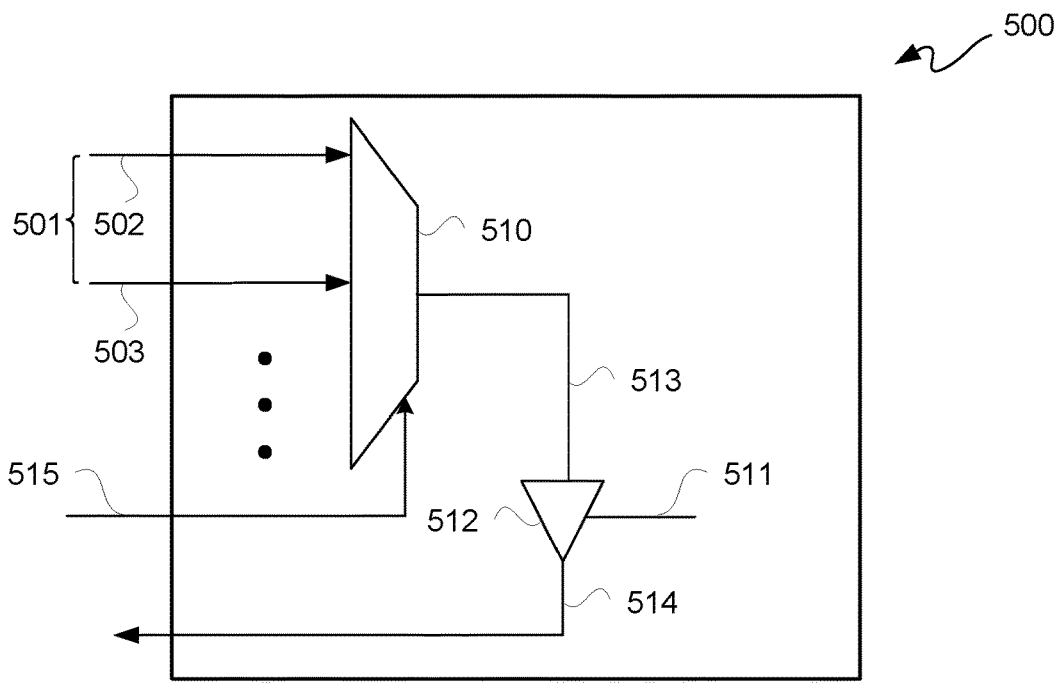
FIG. 5 is a schematic diagram depicting an example of a termination circuit.

FIG. 5 is a schematic diagram depicting an example of a termination circuit 500. Termination circuit 500 is further described with simultaneous reference to FIGS. 1 through 5. Termination circuit 500 may be an example of a termination circuit 212.

In this example of termination circuit 500, there is a multiplexer 510 and a tri-state buffer 512. An input bus 501 is coupled to a data input side of multiplexer 510, and a control port of multiplexer 510 is coupled to receive a select signal 515. Select signal 515 may be provided from a row controller 211, as described below in additional detail.

Inputs 502 and 503 of input bus 501 may be from or the same as an output bus of a last stage of a cascade of frame incrementer circuits 400. Along those lines, input on input 502 may be a current frame count of a first circuit type which is a frame total for such first circuit type for a row of circuit blocks of a matrix, such as matrix 200 for example. Likewise, input on input 503 may be a current frame count of a second circuit type, different from such first circuit type, which is a frame total for such second circuit type for a same row of circuit blocks of a matrix, such as matrix 200 for example. Inputs on input bus 501 may be for a plurality of circuit types of a row, such as for all different circuit types for a row, of rows 201R-204R passing through columns 201C-204C. For an example, where a termination circuit 500 supports more than one row, there may be two input buses 501, where each is for a plurality of all different circuit types for each such row of rows 201R-204R passing through columns 201C-204C.

Output 513 selectively provided from multiplexer 510 may be responsive to sequenced assertion of select signal 515 for sequencing through inputs on input bus 501 for output. Output 513 may be provided to a data input side of tri-state buffer 512.

Tri-state buffer 512 may be coupled to receive an input address or vector 511 as a control signal, as described below in additional detail. Output 514 of tri-state buffer 512 may be a sequence of frame totals for a plurality of different circuit types, as previously described.

Figure 6:
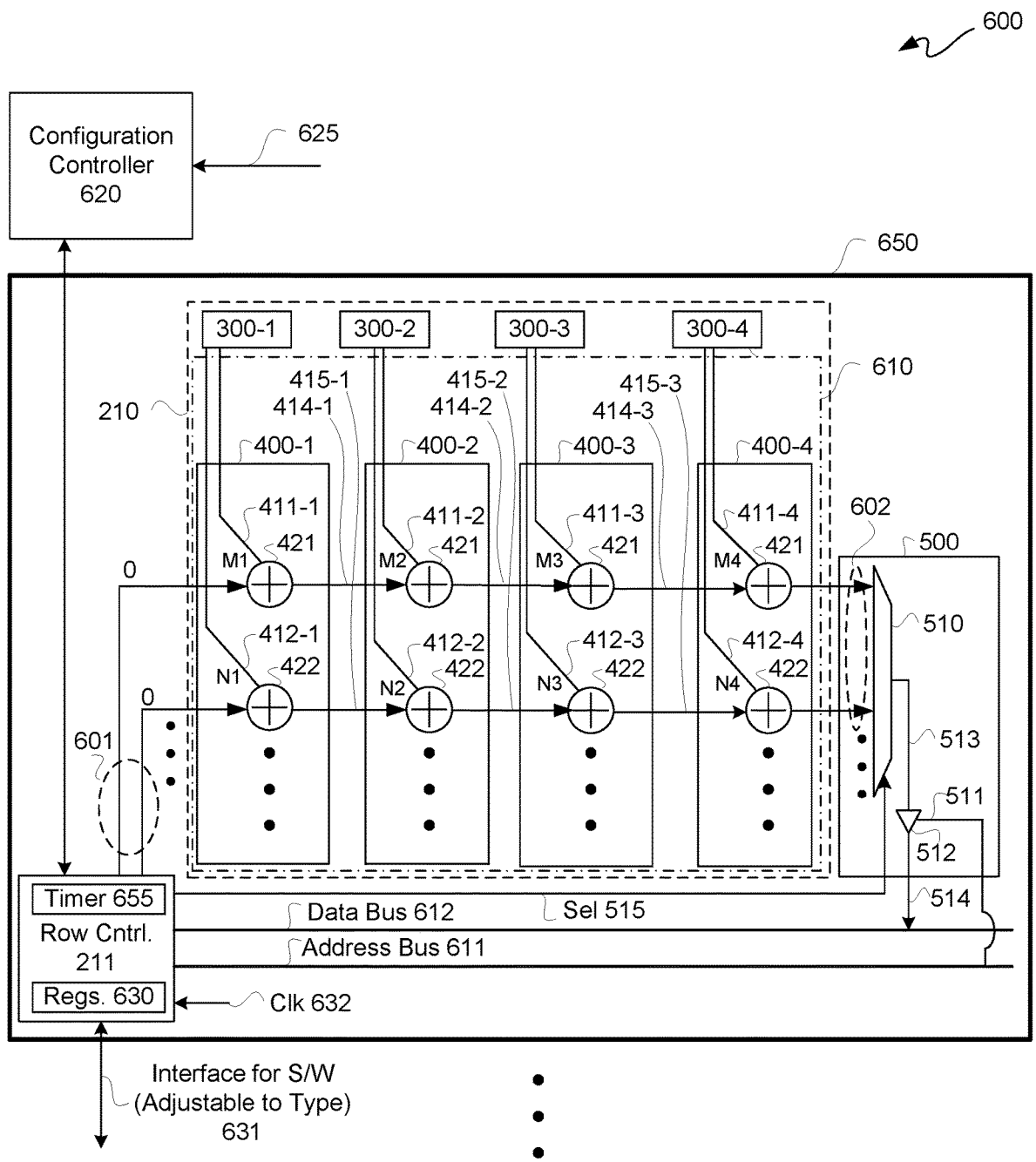
FIG. 6 is a schematic diagram depicting an example of a configuration system for a programmably reconfigurable microelectronic component.

With components of a configuration engine having been described, an example of a configuration engine for an integrated circuit is described with reference to FIG. 6. FIG. 6 is a schematic diagram depicting an example of a configuration system 600 for a programmably reconfigurable microelectronic component. Again, for purposes of clarity by way of example and not limitation, such a programmably reconfigurable microelectronic component may be an FPGA or other integrated circuit with same or similar circuit types. Configuration system 600 is further described with simultaneous reference to FIGS. 1 through 6.

Configuration system 600 may include a main configuration controller 620 and a configuration engine 650. Main configuration controller 620 may be coupled to receive a configuration data stream 625 for programming configuration memory cells 220, as is known and thus not described in unnecessary detail herein for purposes of clarity.

Configuration controller 620, prior to programming configuration memory cells 220, with configuration data from configuration data stream 625, may communicate with row controller 211 of configuration engine 650 to obtain frame counts for circuit types of an FPGA for example. Even though a single instance of a configuration engine 650 is depicted in detail, multiple instances of configuration engine 650 may be used and be in communication with main configuration controller 620.

Configuration engine 650 includes a frame counter 210, a termination circuit 500 and a row controller 211. Such configuration engine 650 may be associated with one or more rows, such as one or more of rows 201R-204R for example passing through columns 201C through 204C of a matrix 200.

Row controller 211 may be configured to initiate frame counter 210. Row controller 211 may be configured to provide an initial input 601 to a first frame incrementer circuit 400-1 input bus of frame incrementer circuits 400 of frame counter 210 and to correspondingly, at least at about the same time, to initiate timer 655. Initial input 601 may be all logic 0s for all inputs to a first stage of frame counter 210 to represent a current frame count of zero for any and all circuit types associated with a row.

Timer 655 may be configured to cause row controller 211 to wait for predetermined period of time after initiation of frame counter 210. This predetermined period of time may be a set number of cycles of a clock signal, as may be determined by a manufacturer or programmed in by a user. Because of a high performance, such as for example about 8 times faster than a conventional configuration engine, the number of clock cycles used by timer 655 is sufficiently small to provide such high performance. Additionally, frame counter 210 need not be directly clocked by an external clock signal, but rather may use data propagation only triggered by receiving an initial control input 601.

Row controller 211 may receive a clock signal 632 for timer 655 thereof to count a number of cycles before assertion of select signal 515 and address signal 511 for reading out frame totals 602 from frame counter 210 on an input bus of multiplexer 510. This counting by timer, which may be triggered with or responsive to assertion of initial input 601, allows for a predetermined period of time to pass before row controller 211 attempts to read out frame totals 602 onto data bus 612 for receipt by row controller 211.

Frame counter 210 includes a cascade 610 of frame incrementer circuits 400. In this example, frame counter 210 includes four cascaded frame incrementer circuits 400-1 through 400-4. However, fewer or more frame incrementer circuits 400 may be cascaded corresponding to a number of circuit columns. For the example of matrix 200, frame counter 210 may have four cascaded frame incrementer circuits 400-1 through 400-4 corresponding to circuit columns 201C through 204C.

In addition to cascaded frame incrementer circuits 400-1 through 400-4, frame counter 210 in this example includes four corresponding hardwired circuits 300-1 through 300-4. Each of frame incrementer circuits 400 is configured to provide corresponding frame sums 414, 415 for frames associated with circuit types, such as of circuit blocks 102, 103, 104, 106. Again, frame incrementer circuits 400 are respectively associated with columns 201C-204C for a row of rows 201R-204R of circuit blocks 102, 103, 104, 106.

Continuing the above example, frame incrementer circuit 400-1 receives initial input 601 of all zeros as inputs to adders 421 and 422. Again through only two adders are depicted, for this example of six circuit types each of frame incrementer circuits 400 may include six adders. In general, there is a series of adders for each circuit type in cascade 610.

Other inputs to adders 421 and 422 of frame incrementer circuit 400-1 respectively are M1 411-1 and N1 412-1 respectively from hardwired circuit 300-1 for a first column 201C. Outputs of adders 421 and 422, which are respectively M1 414-1 and N1 415-1, are respectively provided as inputs to adders 421 and 422 of second stage frame incrementer circuit 400-2.

Other inputs to adder 421 and 422 of frame incrementer circuit 400-2 respectively are M2 411-2 and N2 412-2 respectively from hardwired circuit 300-2 for a second column 202C. Outputs of these adders 421 and 422, which are respectively M1+M2 414-2 and N1+N2 415-2, are respectively provided as inputs to adders 421 and 422 of third stage frame incrementer circuit 400-3.

Other inputs to adder 421 and 422 of frame incrementer circuit 400-3 respectively are M3 411-3 and N3 412-3 respectively from hardwired circuit 300-3 for a third column 203C. Outputs of these adders 421 and 422, which are respectively M1+M2+M3 414-3 and N1+N2+N3 415-3, are respectively provided as inputs to adders 421 and 422 of last stage frame incrementer circuit 400-4.

Other inputs to adder 421 and 422 of frame incrementer circuit 400-4 respectively are M4 411-4 and N4 412-4 respectively from hardwired circuit 300-4 for a fourth column 204C. Outputs of these adders 421 and 422, which are respectively M1+M2+M3+M4 414-4 and N1+N2+N3+N4 415-4, are respectively provided as inputs to multiplexer 510 as corresponding frame totals 602.

Accordingly, frame counter 210 is configured to sequentially add frame sums 414, 415 for columns 201C-204C to provide corresponding frame totals 602 respectively for circuit types of circuit blocks 102, 103, 104, 106. Again, each of hardwired values 411, 412 from hardwired circuits 300 indicate corresponding amounts of frames for each of circuit types in a column of columns 201C-204C for a row of rows 201R-204R of circuit blocks 102, 103, 104, 106. In this example, adders 421, 422 of each of frame incrementer circuits 400 are respectively configured to receive a corresponding portion 411, 412 of a hardwired value of hardwired values for a column of columns 201C-204C associated therewith. These corresponding portions 411, 412 of a hardwired value respectively indicate zero or more frames for a corresponding circuit type of circuit types in a column of columns 201C-204C for a row of rows 201R-204R of circuit blocks 102, 103, 104, 106.

More generally for a matrix 200, frames are circuit type-by-circuit type partitioned by corresponding hardwired values embedded as hardwired circuits 300 of frame counters 210 in rows 201R-204R of circuit blocks 102, 103, 104, 106. Likewise, frame counters 210 may be respectively embedded in circuit blocks 102, 103, 104, 106 of rows 201R-204R. By having row controllers 211 corresponding to rows 201R-204R of circuit blocks 102, 103, 104, 106, each of such row controllers can obtain frame totals 602 for an associated row.

Termination circuit 500 includes a multiplexer 510 configured to multiplex frame totals 602 onto a data bus 612. Row controller 211 may be configured to selectively access frame totals 602 via data bus 612 after a predetermined period of time by assertion of sequencing assertion of select signal 515 and by holding tri-state buffer 512 in a buffering state.

Multiplexer 510 is configured to receive frame totals 602 and a select signal 515 from row controller 211 and to selectively output each of frame totals 602 responsive to sequencing select signal 515 including assertion thereof. Additionally, in this example tri-state buffer 512 is configured to receive a control address 511 for selectively electrically coupling and decoupling output from multiplexer 510 from data bus 612 and is configured to receive each of frame totals 602 sequenced out from multiplexer 510.

In this example, rather than adding separate data and address buses, an existing data bus 612 and an existing address bus 611 used by configuration controller 620 for programming configuration memory cells 220 may be used by row controller 211 during a startup routine. Along those lines, a control address 511, which in this example is all logic 1s which is unique with respect to addressing configuration memory cells 220, is asserted to a control port of tri-state buffer 512 to put same in a buffer state for sequenced providing of frame totals 602 onto data bus 612 for row controller 211.

Thus, each of termination circuits 212 corresponding to rows 201R-204R of circuit blocks 102, 103, 104, 106 may use a same address 511 for putting tri-state buffer 512 in a buffer state. After storing or registering frame totals 602 in registers 630 of row controller 211, row controller 211 may deassert address 511 to put tri-state buffer 512 in a high-impedance state or tri-state.

Frame totals 602 stored in registers 630 may be accessed for subsequent configuration operations, including without limitation reconfiguration operations. Additionally, row controller 211 may include an interface 631 for software access to row controller 211. For example, if only a subset of circuit types are to be identified for frames, row controller 211 may be configured to assert select signal 515 to read out only such subset. Additionally, frame totals 602 stored in registers 630 may be accessed by software.

Again, columns 201C-204C are column-by-column partitioned by correspondence with frame incrementer circuits 400 of a frame counter 210. Additionally, frames are circuit type-by-circuit type partitioned by corresponding hardwired values with embedded hardwired circuits 300 of frame counter 210. Accordingly, row controller 211 does not need to have flags to identify whether a column is a last column in a cascade and does not need to be configured to sequence through frames of configuration memory cells 220. This makes complexity of row controller 211 much simpler than a conventional configuration engine row controller. The absence of such flags for columns and frames may generally be thought of as a flagless or flat address to obtain frame totals for corresponding circuit types.

Figure 7:
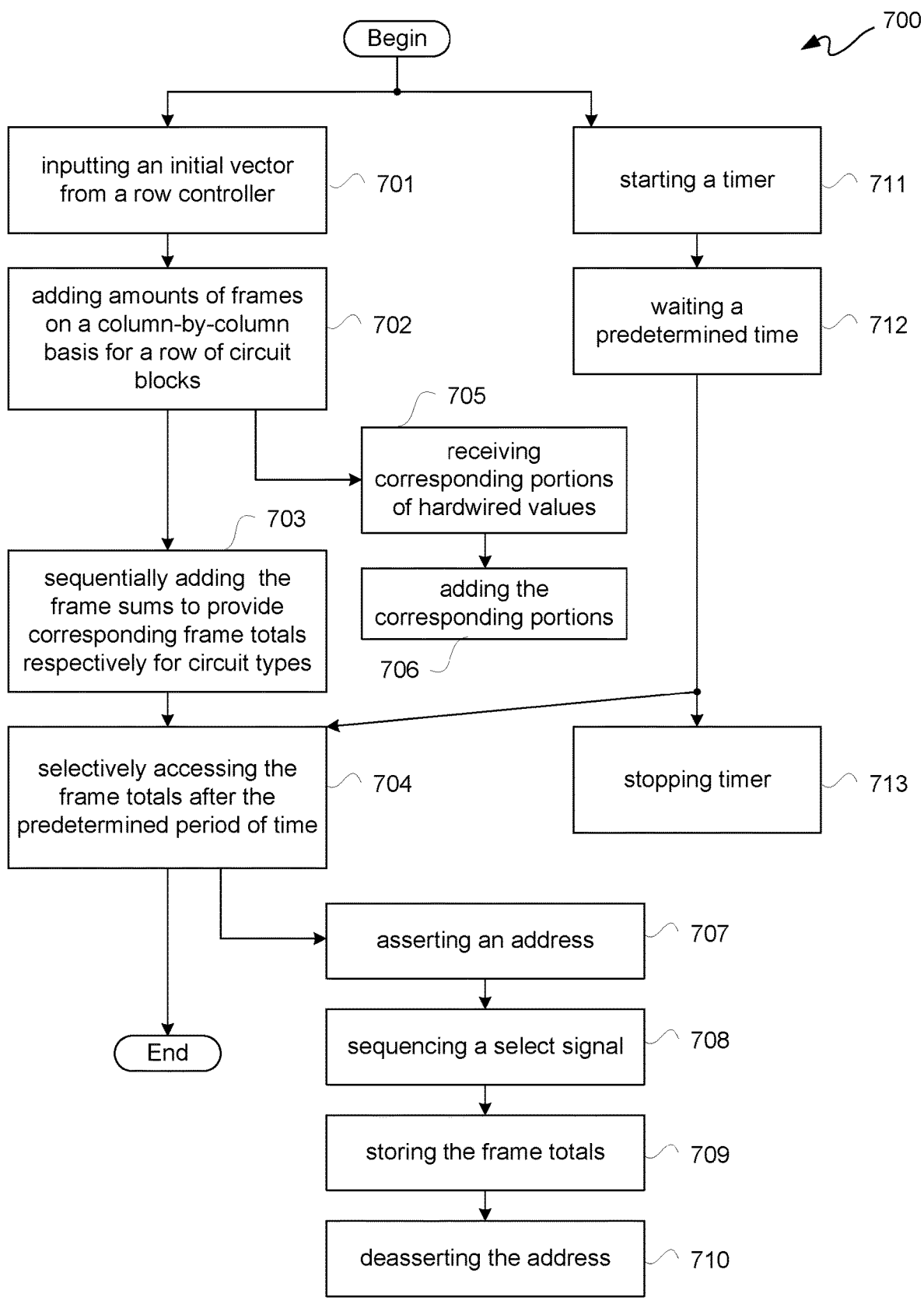
FIG. 7 is a flow diagram depicting an example of a frame totals acquisition process.

FIG. 7 is a flow diagram depicting an example of a frame totals acquisition process 700 for circuit types in accordance with the above-description. Frame totals acquisition process 700 may be for a programmably reconfigurable microelectronic component, such as an FPGA or other integrated circuit. Frame totals acquisition process 700 is further described with simultaneous reference to FIGS. 1 through 7.

At operation 701, an initial vector from a row controller 211 of a configuration engine 650 is input to an initial one of a cascade 610 of frame incrementer circuits 400 of a frame counter 210 of configuration engine 650.

At operation 711, a timer 655 is started by row controller 211 with inputting of initial vector. At operation 702, amounts of frames are added on a column-by-column basis for a row 201R-204R of circuit blocks 102, 103, 104, 106 with frame incrementer circuits 400 to provide frame sums 414, 415 for frames for circuit types associated with circuit blocks 102, 103, 104, 106.

Adding operation 702 may include the following operations. At operation 705, corresponding portions 411, 412 of each of hardwired values for columns 201C-204C associated therewith may be respectively received by adders 421, 422 of each of frame incrementer circuits 400. At operation 706, respective corresponding portions 411, 412 may be added by adders 421, 422 to in-process sums to provide frame sums 414, 415.

At operation 703, frame sums 414, 415 are sequentially added by frame counter 210 to provide corresponding frame totals 602 respectively for circuit types of circuit blocks 102, 103, 104, 106. After waiting for a predetermined time at operation 712 as timed with timer 655 before obtaining frame totals 602, at operation 704 frame totals 602 may be selectively accessed via a data bus 612 by row controller 211 after such a predetermined period of time. At 713, timer 655 may be stopped after such predetermined period of time by row controller 211.

Selectively accessing frame totals 602 at operation 704 may include the following operations. At operation 707, a control address 511 may be asserted by row controller 211 after predetermined period of time to activate a buffer 512 of a termination circuit 212 to electrically couple output of a multiplexer 510 of termination circuit 212 to data bus 612. At operation 708, a select signal 515 may be sequenced by row controller 211 as asserted to multiplexer 510 for multiplexing frame totals 602 onto data bus 612. Accordingly, frames in frame totals 602 are of a configuration memory space, or such as for example a distribution of configuration memory cells 220, in an integrated circuit for programmable circuit blocks thereof. Such frame totals 602 indicate numbers of circuit blocks available for configuration in a configuration memory space. In this example, a termination circuit 212 alone is used to indicate a final one of a sequence of columns in a row has been tallied in frame totals 602. At operation 709, frame totals 602 from data bus 612 may be stored or loaded into registers 630 of row controller 211. At operation 710, a control address 511 may be deasserted by row controller 211 to tri-state buffer 512 to electrically decouple output of multiplexer 510 from data bus 612.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A configuration engine for a programmable circuit, comprising:
a frame counter comprising a cascade of frame incrementer circuits associated with columns for a row of circuit blocks, each frame incrementer circuit configured to provide frame sums for frames associated with the circuit blocks;
the frame counter configured to sequentially add the frame sums for the columns to provide corresponding frame totals respectively for circuit types of the circuit blocks;
a termination circuit configured to multiplex the frame totals onto a data bus; and
a row controller configured to initiate the frame counter and to selectively access the frame totals provided to the data bus.

2. The configuration engine according to claim 1, wherein:

the frames are of a configuration memory space; and the frame totals indicate numbers of the circuit blocks available for configuration in the configuration memory space.

3. The configuration engine according to claim 2, wherein the termination circuit alone is used to indicate a final one of the columns has been tallied in the frame totals.

4. The configuration engine according to claim 2, wherein:

the columns are column-by-column partitioned by a one-to-one correspondence with the frame incrementer circuits; and the frames are associated with groupings of configuration memory cells distributed throughout the circuit blocks.

5. The configuration engine according to claim 4, wherein the frames are circuit type-by-circuit type partitioned by corresponding hardwired values embedded with hardwired circuits of the frame counter.

6. The configuration engine according to claim 5, wherein each of the hardwired values indicate corresponding amounts of the frames for each of the circuit types in a column of the columns for the row of the circuit blocks.

7. The configuration engine according to claim 4, wherein the frame incrementer circuits each comprise adders corresponding to the circuit types of the circuit blocks.

8. The configuration engine according to claim 7, wherein:

the adders of each of the frame incrementer circuits are respectively configured to receive a corresponding portion of a hardwired value of the hardwired values for a column of the columns associated therewith; and the corresponding portion of the hardwired value indicates zero or more of the frames for a circuit type of the circuit types in the column of the columns for the row of the circuit blocks.

9. The configuration engine according to claim 4, wherein the row controller comprises a timer configured to cause the row controller to wait for a predetermined period of time after initiation of the frame counter before obtaining the frame totals.

10. The configuration engine according to claim 9, wherein the row controller is configured to provide an initial input to a first one of the frame incrementer circuits of the frame counter and to correspondingly initiate the timer.

11. The configuration engine according to claim 9, wherein the row controller comprises registers configured to register the frame totals.

12. The configuration engine according to claim 4, wherein the termination circuit comprises:

a multiplexer configured to receive the frame totals and a select signal from the row controller and to selectively output each of the frame totals responsive to sequenced assertion of the select signal; and a tri-state buffer configured to receive a control address for selectively electrically coupling and decoupling output from the multiplexer from the data bus and configured to receive each of the frame totals output from the multiplexer.

13. The configuration engine according to claim 1, further comprising:

row controllers including the row controller corresponding to rows of the circuit blocks;

termination circuits including the termination circuit corresponding to the rows of the circuit blocks; and frame counters including the frame counter respectively embedded in the rows of the circuit blocks.

14. The configuration engine according to claim 13, wherein the frames are circuit type-by-circuit type partitioned by corresponding hardwired values embedded as hardwired circuits of the frame counters in the rows of the circuit blocks.

15. A method for a configuration engine for a programmable circuit, comprising:

inputting an initial vector from a row controller to an initial one of a cascade of frame incrementer circuits of a frame counter;

adding amounts of frames on a column-by-column basis for a row of circuit blocks with the frame incrementer circuits to provide frame sums for the frames for circuit types associated with the circuit blocks;

sequentially adding by the frame counter the frame sums to provide corresponding frame totals respectively for the circuit types of the circuit blocks; and selectively accessing the frame totals by the row controller.

16. The method according to claim 15, wherein the selectively accessing the frame totals comprises:

asserting a control address by the row controller after a predetermined period of time to activate a buffer of a termination circuit to electrically couple output of a multiplexer of the termination circuit to a data bus;

sequencing a select signal by the row controller to the multiplexer for multiplexing the frame totals onto the data bus;

storing the frame totals from the data bus into registers of the row controller; and deasserting the control address by the row controller to tri-state the buffer to electrically decouple output of the multiplexer from the data bus.

17. The method according to claim 15, wherein:

the columns are column-by-column partitioned by a one-to-one correspondence with the frame incrementer circuits; and the frames associated with groupings of configuration memory cells are circuit type-by-circuit type partitioned by corresponding hardwired values embedded with hardwired circuits of the frame counter.

18. The method according to claim 17, wherein each of the hardwired values indicate corresponding amounts of the frames for each of the circuit types in a column of the columns for the row of the circuit blocks.

19. The method according to claim 18, wherein the adding comprises:

receiving corresponding portions of each of the hardwired values for the columns associated therewith respectively by adders of each of the frame incrementer circuits;

adding by the adders the corresponding portions to in-process sums to provide the frame sums; and the corresponding portions of the hardwired values each indicating zero or more of the frames for each of the circuit types in the row of the circuit blocks.

20. The method according to claim 15, further comprising:

starting a timer by the row controller with the inputting of the initial vector; and timing with the timer to wait for a predetermined time before asserting the sequencing of the select signal.

* * * * *